United States Patent [19]

Althaus et al.

[11] Patent Number: 5,255,333
[45] Date of Patent: Oct. 19, 1993

[54] OPTO-ELECTRONIC TRANSDUCER ARRANGEMENT HAVING A LENS-TYPE OPTICAL COUPLING

[75] Inventors: Hans-Ludwig Althaus, Lappersdorf; Ralf Dietrich, Munich; Erich Hufgard, Regensburg; Werner Spaeth, Holzkirchen, all of Fed. Rep. of Germany

[73] Assignee: Siemens Aktiengesellschaft, Munich, Fed. Rep. of Germany

[21] Appl. No.: 896,918

[22] Filed: Jun. 11, 1992

Related U.S. Application Data

[63] Continuation of Ser. No. 564,605, Aug. 9, 1990, abandoned.

[30] Foreign Application Priority Data

Aug. 9, 1989 [EP] European Pat. Off. ......... 89114735

[51] Int. Cl.⁵ .............................................. G02B 6/28
[52] U.S. Cl. .................................... 385/33; 385/31
[58] Field of Search ............ 350/96.15, 96.17, 96.18; 374/17, 19, 74; 385/15, 31, 33, 35, 51, 52

[56] References Cited

U.S. PATENT DOCUMENTS

| | | | |
|---|---|---|---|
| 4,233,619 | 11/1980 | Webb et al. | 350/96.17 X |
| 4,295,152 | 10/1981 | Khoe et al. | 350/96.21 X |
| 4,355,323 | 10/1982 | Kock | 357/74 |
| 4,726,645 | 2/1988 | Yamashita et al. | 350/96.75 X |
| 4,741,796 | 5/1988 | Althaus et al. | 156/272.4 |
| 4,752,109 | 6/1988 | Gordon | 350/96.2 |
| 4,762,386 | 8/1988 | Gordon | 350/96.2 |
| 4,818,053 | 4/1989 | Gordon | 350/96.18 |
| 4,888,081 | 12/1989 | Althaus et al. | 156/359 |
| 4,989,930 | 2/1991 | Nakagawa et al. | 385/35 |
| 5,016,965 | 5/1991 | Marshall et al. | 385/35 |
| 5,068,865 | 11/1991 | Ohshima et al. | 385/51 |

FOREIGN PATENT DOCUMENTS

4-204405 7/1992 Japan ...................... 385/15

OTHER PUBLICATIONS

Patent Abstracts of Japan, Band 8, No. 217 (E-270) Oct. 4, 1984.
Patent Abstracts of Japan, Band 13, No. 149, (P-855), Apr. 12, 1989.
Patent Abstracts of Japan, Band 6, No. 164 (E-127), Aug. 27, 1982.
Patent Abstracts of Japan, Band 8, No. 105 (P-274) May 17, 1984.

Primary Examiner—Rodney B. Bovernick
Assistant Examiner—Stephen W. Barns
Attorney, Agent, or Firm—Hill, Steadman & Simpson

[57] ABSTRACT

An opto-electronic transducer having a lens-type optical coupling wherein a lens within a lens carrier is arranged in the beam path immediately in front of the transducer. The lens carrier, together with the lens, are fixed to a fastening part by a fastening layer that is adjusted relative to the beam axis of the transducer. The fastening part is part of a common carrier for the transducer. The opto-electronic transducer and the lens carrier together with the lens are secured on the common carrier in such a spacial relationship relative to one another that the beam axis of the transducer is perpendicular to the surface formed by the fastening layer. The opto-electronic transducer of the invention is particularly suited for use as a light waveguide transmission or reception component or, alternatively, as an individual light source.

24 Claims, 1 Drawing Sheet

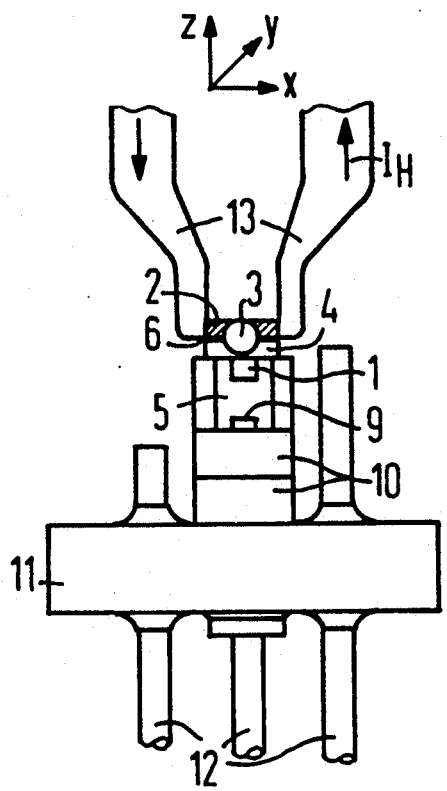
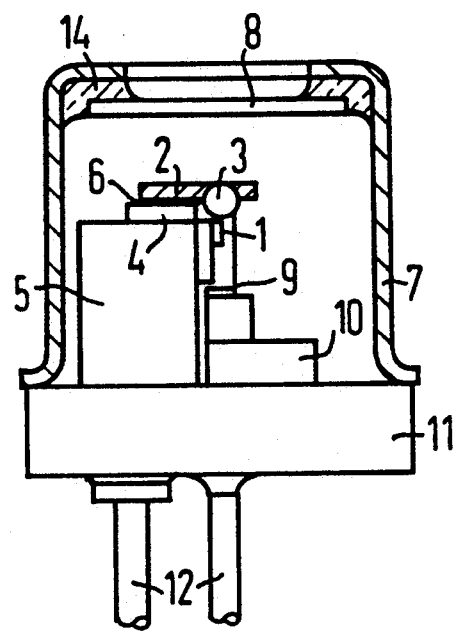
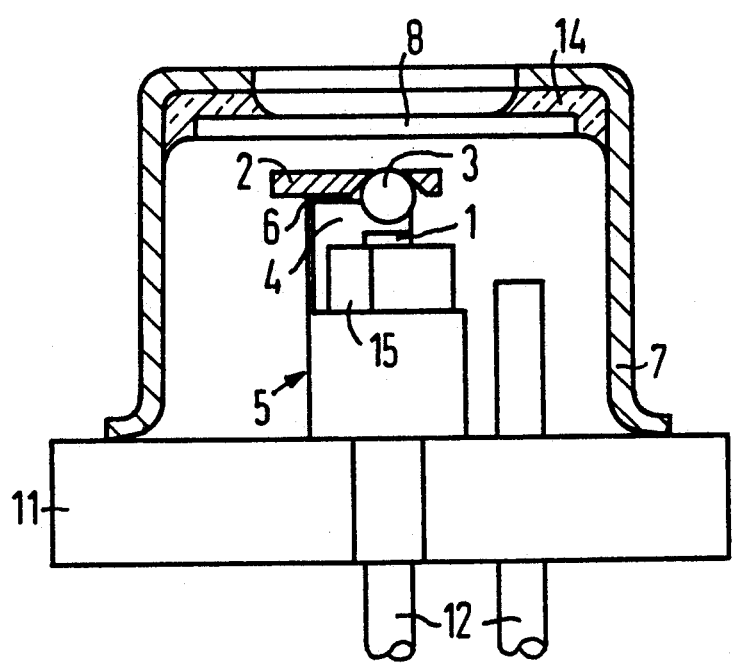

OPTO-ELECTRONIC TRANSDUCER ARRANGEMENT HAVING A LENS-TYPE OPTICAL COUPLING

This is a continuation of application Ser. No. 07/564,605, filed Aug. 9, 1990, abandoned.

BACKGROUND OF THE INVENTION

1. Field of the Invention

The present invention is directed to an opto-electronic transducer arrangement that utilizes a lens-type optical coupling.

2. Description of the Related Art

Opto-electronic transducer arrangements are employed in light waveguide transmission or, respectively, receiver systems. Lenses, for example, spherical lenses, are employed for optically coupling the light emanating from or received by a transducer component into or out of the light waveguide. The light waveguide, for example, may be an optical fiber.

In such opto-electronic transducer arrangements, the adjustment and fixing of the lens is particularly difficult. This is particularly true in view of the fact that the lens must be held in an exactly defined position immediately in front of the transducer component over a long period of time. The lens must be held in this position with tolerances in the sub-micrometer range when the optical coupling is to be undertaken with a light waveguide (i.e., a monomode optical fiber). Moreover, a simple and time-efficient adjustment of the lens to optimize the input or, respectively, output from the transducer component is desirable. Furthermore, it is desirable to avoid a deterioration of the transducer component or, respectively, of the active semiconductor chip that occurs due to the mechanical deformation of the lens mount. Finally, an effort must be made to keep the external dimensions of the transducer arrangement small despite the use of the lens-type optical coupling.

European Patent EP-A-0204224 discloses a light transmission or reception component. More specifically, it discloses a method for the manufacture of the component as well as an apparatus for the implementation of the method. The component serves as a coupling to light waveguides. A lens for use as an optical coupling can be indirectly fixed to a carrier by a piece of semiconductor material. The adjustment and fixing of the lens occurs by virtue of a fastening material, preferably solder. The fastening material is melted by heating the material so that it becomes a liquid thereby allowing the solid member serving as the lens carrier to be fixed and adjusted. The fastening material is subsequently cooled to fix the solid member.

SUMMARY OF THE INVENTION

It is an object of the invention to fashion an opto-electronic transducer arrangement having a lens-type optical coupling such that a lens arranged in the beam path immediately in front of a transducer component can be precisely adjusted and subsequently fixed in an optimally simple and efficient manner. The precise and space-saving transducer arrangement makes the arrangement especially suitable for use as a light waveguide transmission or reception component as well as an individual light source having a defined emission characteristic.

The above-stated object is accomplished in an opto-electronic transducer arrangement having a lens-type optical coupling wherein a lens and a lens carrier are arranged in a beam path immediately in front of a transducer component. The lens carrier and the lens itself are fixed to a fastening part of a common carrier by a fastening layer. The lens carrier and lens are secured on the common carrier so that the beam axis of the transducer component is perpendicular to the surface formed by the fastening layer.

Employment of the invention results in a significantly more compact structure due to the specific arrangement of the transducer component and lens carrier on a common carrier. The compact structure, in turn, results in a reduction in the space requirements of the transducer arrangement with the coupling optics and allows a miniaturization of the overall component. A particular advantage in employing the invention is that it is possible to adjust and subsequently fix the lens directly in front of the transducer component in a simple and fast manner and with a high degree of precision. The high degree of precision in the adjustment tolerances of the transducer arrangement allows the transducer component to be used in light waveguide transmission or reception devices, particularly in modular structures, without additional adjustment outlays.

The transducer component of the invention is arranged so that the beam axis of the transducer resides perpendicular to the surface formed by the fastening layer and the lens carrier. Consequently, an adjustment in the direction of the beam axis can be undertaken by varying the thickness of the fastening layer. An adjustment performed in this manner has a significantly greater influence on the optical coupling since the adjustment occurs in the more sensitive plane (i.e., in the surface formed by or, respectively, erected by the fastening layer). The light emitted by the transducer component (which, for example, can be a laser diode, an LED or an IRED) is thus advantageously employed as an adjustment aid. The lens fastened on the lens carrier as the optical coupling is preferably a spherical or cylindrical lens. It may also be fashioned as a planoconvex lens.

It can be particularly advantageous, in optimizing the space, adjustment and fastening requirements to integrate the lens in the form of a cylinder, sphere, hemisphere or spherical segment into the carrier. This is even more advantageous when the carrier and the lens are composed of the same material, for example, silicon, and form a single unitary structure. It can also be advantageous to employ a mirror as the optical coupling instead of the integrated lens/lens carrier.

BRIEF DESCRIPTION OF THE DRAWINGS

Other objects, features and advantages of the present invention will become apparent upon reference to the accompanying description when taken in conjunction with the following drawings, on which:

FIG. 1 is a front plan view of an embodiment of the invention wherein an opto-electronic transducer is shown in the form of a laser module.

FIG. 2 is a side elevational view of the laser module of FIG. 1 and further including a housing.

FIG. 3 is a side view of a further embodiment of the invention wherein an opto-electronic transducer is shown in the form of a detector.

DESCRIPTION OF THE PREFERRED EMBODIMENT

An opto-electronic transducer arrangement constructed in accordance with the invention is shown in FIGS. 1 and 2. As shown, the transducer arrangement has a laser diode 1 (transducer component). The transducer arrangement utilizes a lens-type optical coupling comprising a lens 3 (a spherical lens in this example) that is arranged on a lens carrier 2 that, for example, is made of silicon. The lens is placed immediately in front of the laser diode 1 in the beam path.

The lens 3 is secured in an opening of the lens carrier 2. This opening is preferably in the shape of a truncated pyramid. When the lens carrier 2 is made of a silicon material, the opening may be produced by anisotropic etching and the lens may be fastened in the opening by, for example, soldering or gluing.

The lens carrier 2 and the lens 3 are adjusted relative to the beam axis of the laser diode 1 by a fastening layer 6. The fastening layer 6 is preferably composed of a soft solder layer. The lens carrier 2 and lens 3 are fixed to a fastening part 4 which serves as a heat barrier. The fastening part 4 may, for example, be composed of glass. The fastening part 4 is part of a common carrier 5 for the opto-electronic transducer, i.e., for the laser diode in this example. In cases wherein a laser diode is employed as the transducer component, it is expedient to fashion the common carrier 5 as a heat sink for the laser diode. The laser diode 1 and the lens carrier 2, together with the lens 3, are secured on the common carrier 5 so that the beam axis of the laser diode 1 is substantially perpendicular to the surface formed between the fastening layer 6 and lens carrier 2.

A modular structure is used throughout the transducer arrangement with the laser diode 1 serving as the central unit. A monitor diode 9 is provided to assist in maintaining the radiation output at a constant level. This is particularly important for light waveguide transmission purposes. The monitor diode 9 is secured on two spacers 10 composed, for example, of ceramic. The monitor diode 9 is disposed in the back beam path of the laser diode 1. Spacers 10 are applied to a base part 11 through which electrical leads 12 are provided for connection to the active components (the laser diode 1 and the monitor diode 9). These leads are conducted to the active components in a hermetically sealed fashion.

FIG. 1 also includes a schematic representation of the heating and adjustment means employed for adjusting and fixing the lens 3 or, respectively, the lens carrier 2. The heating and adjustment means is comprised of two forceps-shaped electrodes 13 through which a heating current $I_H$ is directed. The two forceps-shaped electrodes 13 are secured to an X, Y, Z manipulator (not shown). The electrodes 13 clamp the lens carrier 2 and the lens 3 during the adjustment process. The fastening layer 6, preferably composed of soft solder, is heated by the power that is dissipated by the lens carrier 2 when the current $I_H$ is passed therethrough. The current flows through the lens carrier 2 by virtue of the metal-to-semiconductor (Schottky) contact between the electrodes 13 and the lens carrier 2 and produces heat by virtue of the resistance of the material that is employed for the lens carrier 2.

The lens spacing adjustment takes place in the z-direction. The z-direction is identical to the direction of the beam axis of the transducer component (i.e., the beam axis of the laser diode 1 in this example). The fine adjustment of the lens occurs in the plane of the surface of the fastening layer 6 (i.e., in the X and Y directions).

When the lens 3 and lens carrier 2 are constructed as two discreet parts, the lens 3 must first be adjusted and subsequently fixed on the lens carrier 2. It is expedient to employ a solder, glass solder or a glue for fastening the lens on the carrier 2. The glue must have a higher melting point than the fastening layer 6 for proper operation. The lens carrier 2 is then adjusted and subsequently fixed on the fastening part 4 by the fastening layer 6. What is achieved by adjusting and fixing the lens carrier 2 on the fastening part 4 in this manner is that the lens 3 does not again disengage from its position in the opening of the lens carrier 2.

In the exemplary embodiment shown in FIG. 2, the transducer arrangement shown in FIG. 1 is surrounded by a hermetically sealed, cap-shaped housing 7 which shields the transducer from disturbing environmental influences. The housing 7 may, for example, be composed of a Fe-Co-Ni melt-down alloy. A planar window 8 may be disposed in the upper part of the housing to form a light exit opening. The planar window 8 is secured to the housing 7 with a glazing 14. The planar surface of the window 8 proceeds perpendicularly or at an angle $\alpha$ relative to the beam axis of the laser diode 1. Similarly, the planar surface of the window 8 proceeds parallel to or at an angle $\beta$ relative to the fastening layer 6 that is situated between the lens carrier 2 and the fastening part 4.

The opto-electronic transducer arrangement shown in FIG. 3 is fashioned as a radiation detector having a radiation detecting transducer component 1'. The transducer is surrounded by a cap-shaped housing 7' that is hermetically sealed to a base part 11'. The base part 11' is provided with electrical leads 12'. A planar window 8' that allows the entry of light is attached with a glazing 14' to the upper part of the cap-shaped housing 7'. The planar surface of the window 8' is perpendicular to the beam axis of the radiation detecting transducer component 1' and proceeds parallel to the fastening layer 6'. The fastening layer 6' is provided for adjusting and fixing the lens carrier 2' that holds the lens 3'. In the exemplary embodiment, the radiation detecting transducer component 1' that is employed as the transducer component is a photodiode. The radiation detecting transducer component 1' is secured on a common carrier 5' in such a spacial relationship relative to the lens carrier 2' that the beam axis of the radiation detecting transducer component resides perpendicular to the surface formed between the fastening layer 6' and the lens carrier 2'.

The fastening layer is preferably formed of a soft solder layer. The fastening layer 6' or, as the case may be, the adjustment solder, is situated between the lens carrier 2' and the fastening part 4'. The fastening part 4' is a component part of the common carrier 5' in this example. The common carrier 5' and the fastening part 4' may, for example, be formed as a metal or ceramic part. The common carrier 5' is secured to the base part 11'. The common carrier 5' also functions as a spacer part or respectively, a height spacer and mounting block. The radiation detecting transducer component 1' is secured on an insulating member 15', for example, on an $Al_2O_3$ insulator, which is particularly important when the radiation detecting transducer component is a photodiode composed of a metal. The adjustment and fixing of the lens carrier 2' together with the lens 3' on the 6' is preferably done using the method that was described for aligning the apparatus shown in FIG. 1.

Although changes and modifications may be suggested by those skilled in the art, it is the intention of the inventors to embody within the patent warranted hereon all such changes and modifications as reasonably and properly fall within the scope of the inventors' contribution to the art.

We claim:

1. An opto-electronic transducer arrangement comprising:
    a transducer component having a beam axis;
    an optical coupling lens;
    a lens carrier holding the optical coupling lens;
    a common carrier in which said transducer is disposed having a fastening part disposed immediately above and covering said transducer;
    fastening layer means, disposed between and directly joining the fastening part of the common carrier and the lens carrier, for adjusting the position of the optical coupling lens relative to said fastening layer means;
    said transducer component, said lens carrier, said optical coupling lens and said common carrier all being directly connected as a unit in a spacial relationship relative to one another with the bean axis of the transducer component being substantially perpendicular to said fastening layer means.

2. An opto-electronic transducer arrangement as recited in claim 1, wherein the optical coupling lens is a lens type selected from the group consisting of a spherical lens, a cylindrical lens and a planoconvex lens.

3. An opto-electronic transducer arrangement as recited in claim 1, wherein the optical coupling lens forms a part of the lens carrier.

4. An opto-electronic transducer arrangement as recited in claim 1 wherein the optical coupling lens is a lens type selected from the group consisting of a spherical lens and a cylindrical lens and wherein the optical coupling lens is secured in an opening in the lens carrier.

5. An opto-electronic transducer arrangement as recited in claim 1, wherein the lens carrier is composed of silicon.

6. An opto-electronic transducer arrangement as recited in claim 1, wherein the fastening layer is a layer having a variable thickness.

7. An opto-electronic transducer arrangement as recited in claim 1, wherein the fastening layer is a solder layer.

8. An opto-electronic transducer arrangement as recited in claim 1 wherein the transducer component is hermetically sealed in a cap-shaped housing, the cap-shaped housing including an upper part with a planar window, the planar window having a planar surface that is perpendicular to the beam axis of the transducer component and that is parallel to the surface formed by the fastening layer and the lens carrier.

9. An opto-electronic transducer arrangement as recited in claim 1, wherein the transducer is a laser diode and the common carrier serves as a heat sink.

10. An opto-electronic transducer arrangement as recited in claim 1, wherein the transducer is an LED.

11. An opto-electronic transducer arrangement as recited in claim 1, wherein the transducer is an IRED.

12. An opto-electronic transducer arrangement as recited in claim 1, wherein the transducer is a photodiode.

13. A light waveguide transmission module comprising:
    a transducer component having a beam axis, the transducer component adapted to convert electrical energy into light energy;
    an optical coupling lens;
    a lens carrier holding the optical lens;
    a common carrier holding the optical coupling lens;
    a common carrier in which said transducer is disposed having a fastening part disposed immediately above and covering said transducer;
    planar fastening layer means disposed between and directly joining the fastening part of the common carrier and the lens carrier, for adjusting the position of the optical coupling lens relative to the plane of said fastening layer means with respect to the transducer component, the fastening layer and the lens carrier forming a surface therebetween;
    said transducer component and said lens carrier holding said optical coupling lens being secured on said common carrier in a spacial relationship relative to one another with the beam axis of the transducer component being substantially perpendicular to said plane of said fastening layer means.

14. A light waveguide transmission module as recited in claim 13, wherein the optical coupling lens is a lens type selected from the group consisting of a spherical lens, a cylindrical lens and a planoconvex lens.

15. A light waveguide transmission module as recited in claim 13, wherein the transducer is a laser diode and the common carrier serves as a heat sink.

16. A light waveguide transmission module as recited in claim 13, wherein the transducer is an IRED.

17. A light waveguide transmission module as recited in claim 13, wherein the transducer is an LED.

18. A light waveguide transmission module as recited in claim 13, wherein the transducer component is hermetically sealed in a cap-shaped housing, the cap-shaped housing including an upper part with a planar window, the planar window having a planar surface that ks perpendicular to the beam axis of the transducer component and that is parallel to the surface formed by the fastening layer and the lens carrier.

19. A light waveguide transmission module as recited in claim 13, wherein the fastening layer is a solder layer.

20. A light waveguide reception module comprising:
    a transducer component having a beam axis, the transducer component adapted to convert light energy received along the beam axis into electrical energy;
    an optical coupling lens;
    a lens carrier holding the optical coupling lens;
    a common carrier in which said transducer is disposed having a fastening part disposed immediately above and covering said transducer;
    planar fastening layer means disposed between and directly joining the fastening part of the common carrier and the lens carrier, for adjusting the position of the optical coupling lens relative to the plane of said fastening layer means with respect to the transducer component, the fastening layer and the lens carrier forming a surface therebetween;
    said transducer component and said lens carrier holding said optical coupling lens being secured on said common carrier in a spacial relationship relative to one another with the beam axis of the transducer component being substantially perpendicular to said plane of said fastening layer means.

21. A light waveguide reception module as recited in claim 20, wherein the transducer is a photodiode.

22. A light waveguide reception module as recited in claim 20, wherein the optical coupling lens is a lens type selected from the group consisting of a spherical lens, a cylindrical lens and a planoconvex lens.

23. A light waveguide reception module as recited in claim 20, wherein the transducer component is hermetically sealed in a cap-shaped housing, the cap-shaped housing including an upper part with a planar window, the planar window having a planar surface that is perpendicular to the beam axis of the transducer component and that is parallel to the surface formed by the fastening layer and the lens carrier.

24. A light waveguide reception module as recited in claim 20, wherein the fastening layer is a solder layer.

* * * * *